US009564688B2

(12) United States Patent
Suzuki et al.

(10) Patent No.: US 9,564,688 B2
(45) Date of Patent: Feb. 7, 2017

(54) WIRELESS CHIP AND ELECTRONIC DEVICE HAVING WIRELESS CHIP

(71) Applicant: Semiconductor Energy Laboratory Co., Ltd., Atsugi-shi, Kanagawa-ken (JP)

(72) Inventors: Yukie Suzuki, Isehara (JP); Yasuyuki Arai, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/155,096

(22) Filed: May 16, 2016

(65) Prior Publication Data

US 2016/0261048 A1    Sep. 8, 2016

Related U.S. Application Data

(63) Continuation of application No. 14/269,772, filed on May 5, 2014, now Pat. No. 9,350,079, which is a
(Continued)

(30) Foreign Application Priority Data

Mar. 31, 2005    (JP) ................ 2005-103233

(51) Int. Cl.
*H01L 27/108*    (2006.01)
*H01Q 9/04*    (2006.01)
(Continued)

(52) U.S. Cl.
CPC ...... *H01Q 9/0407* (2013.01); *G06K 19/07745* (2013.01); *G06K 19/07749* (2013.01);
(Continued)

(58) Field of Classification Search
CPC .. H01L 23/66; H01L 27/73; H01L 2223/6677; H01L 2224/16; H01L 2924/00014; H01Q 9/0407; H01Q 1/2208; H01Q 1/2283; G06K 19/07749
See application file for complete search history.

(56) References Cited

U.S. PATENT DOCUMENTS 4,903,326 A    2/1990  Zakman et al.
5,115,245 A    5/1992  Wen et al.
(Continued)

FOREIGN PATENT DOCUMENTS

EP    1304766 A    4/2003
JP    05-014032 A  1/1993
(Continued)

OTHER PUBLICATIONS

International Search Report (Application No. PCT/JP2006/306606) Dated May 16, 2006.
(Continued)

*Primary Examiner* — Yosef Gebreyesus
(74) *Attorney, Agent, or Firm* — Robinson Intellectual Property Law Office; Eric J. Robinson

(57) ABSTRACT

It is an object to provide a wireless chip which can increase a mechanical strength, and a wireless chip with a high durability. A wireless chip includes a transistor including a field-effect transistor, an antenna including a dielectric layer sandwiched between conductive layers, and a conductive layer connecting the chip and the antenna. Further, a wireless chip includes a transistor including a field-effect transistor, an antenna including a dielectric layer sandwiched between conductive layers, a sensor device, a conductive layer connecting the chip and the antenna, and a conductive layer connecting the chip and the sensor device. Moreover, a wireless chip includes a transistor including a field-effect transistor, an antenna including a dielectric layer sand-
(Continued)

wiched between conductive layers, a battery, a conductive layer connecting the chip and the antenna, and a conductive layer connecting the chip and the battery.

16 Claims, 15 Drawing Sheets

Related U.S. Application Data continuation of application No. 13/081,519, filed on Apr. 7, 2011, now Pat. No. 8,742,480, which is a continuation of application No. 11/886,157, filed as application No. PCT/JP2006/306606 on Mar. 23, 2006, now Pat. No. 7,928,910.

(51) Int. Cl.
*G06K 19/077* (2006.01)
*H01Q 1/22* (2006.01)
*H01Q 23/00* (2006.01)
*H01L 23/66* (2006.01)
*H01L 23/00* (2006.01)
*H01L 27/088* (2006.01)
*H01M 10/04* (2006.01)
*H01M 10/46* (2006.01)

(52) U.S. Cl.
CPC ........ *G06K 19/07786* (2013.01); *H01L 23/66* (2013.01); *H01L 24/17* (2013.01); *H01L 24/32* (2013.01); *H01L 24/73* (2013.01); *H01Q 1/2208* (2013.01); *H01Q 1/2283* (2013.01); *H01Q 23/00* (2013.01); *H01L 27/088* (2013.01); *H01L 2223/6677* (2013.01); *H01L 2224/05568* (2013.01); *H01L 2224/05573* (2013.01); *H01L 2224/16* (2013.01); *H01L 2224/16225* (2013.01); *H01L 2224/16265* (2013.01); *H01L 2224/32225* (2013.01); *H01L 2224/73204* (2013.01); *H01L 2924/00014* (2013.01); *H01L 2924/01025* (2013.01); *H01L 2924/01046* (2013.01); *H01L 2924/01078* (2013.01); *H01L 2924/01079* (2013.01); *H01L 2924/07811* (2013.01); *H01L 2924/09701* (2013.01); *H01L 2924/12041* (2013.01); *H01L 2924/12044* (2013.01); *H01L 2924/13091* (2013.01); *H01L 2924/3011* (2013.01); *H01M 10/0436* (2013.01); *H01M 10/465* (2013.01); *H01M 2220/30* (2013.01)

(56) References Cited

U.S. PATENT DOCUMENTS

| | | |
|---|---|---|
| 5,400,039 A | 3/1995 | Araki et al. |
| 5,404,581 A | 4/1995 | Honjo |
| 5,510,758 A | 4/1996 | Fujita et al. |
| 5,628,053 A | 5/1997 | Araki et al. |
| 5,903,239 A | 5/1999 | Takahashi et al. |
| 5,907,477 A | 5/1999 | Tuttle et al. |
| 5,990,839 A | 11/1999 | Schefte et al. |
| 6,181,278 B1 | 1/2001 | Kakimoto et al. |
| 6,215,454 B1 | 4/2001 | Tran |
| 6,331,722 B1 | 12/2001 | Yamazaki et al. |
| 6,666,380 B1 | 12/2003 | Suzuya |
| 6,777,620 B1 | 8/2004 | Abe |
| 6,809,688 B2 | 10/2004 | Yamada |
| 6,841,871 B2 | 1/2005 | Usami |
| 7,089,032 B2 | 8/2006 | Hongo et al. |
| 7,110,741 B2 | 9/2006 | Knopik |
| 7,459,761 B2 | 12/2008 | Lin |
| 7,635,014 B2 | 12/2009 | Takahashi et al. |
| 7,685,706 B2 | 3/2010 | Maruyama et al. |
| 7,928,910 B2 | 4/2011 | Suzuki et al. |
| 2001/0006906 A1 | 7/2001 | Hunt |
| 2002/0175873 A1 | 11/2002 | King et al. |
| 2003/0094697 A1 | 5/2003 | Higashida et al. |
| 2003/0143971 A1 | 7/2003 | Hongo et al. |
| 2003/0148739 A1 | 8/2003 | Kosemura et al. |
| 2004/0113844 A1 | 6/2004 | Knopik et al. |
| 2004/0188774 A1 | 9/2004 | Takeda et al. |
| 2005/0134507 A1 | 6/2005 | Dishongh et al. |
| 2006/0017616 A1 | 1/2006 | Hsu et al. |
| 2006/0032926 A1* | 2/2006 | Baba ................ G06K 19/07749 235/492 |
| 2006/0202269 A1 | 9/2006 | Suzuki et al. |
| 2006/0267135 A1 | 11/2006 | Wolfgang et al. |
| 2008/0055166 A1 | 3/2008 | Kobayashi |
| 2008/0169349 A1 | 7/2008 | Suzuki et al. |

FOREIGN PATENT DOCUMENTS

| | | |
|---|---|---|
| JP | 05-067911 A | 3/1993 |
| JP | 05-067919 A | 3/1993 |
| JP | 05-183328 A | 7/1993 |
| JP | 06-152237 A | 5/1994 |
| JP | 07-074285 A | 3/1995 |
| JP | 08-056113 A | 2/1996 |
| JP | 09-001970 A | 1/1997 |
| JP | 09-148840 A | 6/1997 |
| JP | 09-167908 A | 6/1997 |
| JP | 10-145144 A | 5/1998 |
| JP | 10-233621 A | 9/1998 |
| JP | 2001-084343 A | 3/2001 |
| JP | 2004-088508 A | 3/2004 |
| JP | 2005-019649 A | 1/2005 |
| WO | WO-02/03499 | 1/2002 |
| WO | WO-02/17502 | 2/2002 |

OTHER PUBLICATIONS

Written Opinion (Application No. PCT/JP2006/306606) Dated May 16, 2006.

* cited by examiner

WIRELESS CHIP AND ELECTRONIC DEVICE HAVING WIRELESS CHIP

TECHNICAL FIELD

The present invention relates to a wireless chip which can communicate data by wireless communication and an electronic device having a wireless chip.

BACKGROUND ART

In recent years, development of a wireless chip including a plurality of circuits and an antenna is advanced. Such a wireless chip is called as an ID tag, an IC tag, an IC chip, an RF (Radio Frequency) tag, a wireless tag, an electronic tag, and an RFID (Radio Frequency Identification) tag, and has already been introduced into some markets.

Many of these wireless chips which are put into practical use at present, include a circuit (referred to as an IC (Integrated Circuit) chip) with the use of a semiconductor substrate such as a silicon and an antenna. The antenna is formed by a technique such as a printing method, a method of etching a conductive thin film, and a plating method (for example, refer to the Patent Document 1).
[Patent Document 1] Japanese Patent Laid-Open No. Hei9-1970

DISCLOSURE OF INVENTION

The antenna formed by the above technique is a thin film or a thick film. An antenna attached to a flexible material such as paper and plastic, is weak in bending or folding so that one part of the antenna is easy to be broken. Further, the wireless chip having such an antenna has a problem that durability is low.

In view of the above problem, it is an object of the present invention to provide a wireless chip that can enhance a mechanical strength. In addition, it is an object of the present invention to provide a wireless chip having a high durability. Further, it is an object of the present invention to provide a product having a wireless chip.

One feature of the present invention is a chip including a transistor which has a field-effect transistor; an antenna which has a dielectric layer and a plurality of conductive layers sandwiching the dielectric layer, and a conductive layer connecting the chip and the antenna.

In addition, one feature of the present invention is a chip including a transistor which has a field-effect transistor; an antenna which has a dielectric layer and a plurality of conductive layers sandwiching the dielectric layer; a sensor device; a conductive layer connecting the chip and the antenna, and a conductive layer connecting the chip and the sensor. Note that the chip, the antenna, and the sensor device are mounted on a wiring substrate. Further, the chip and the sensor device are mounted at the opposite side of the antenna in the wiring substrate.

In addition, one feature of the present invention is a chip including a transistor which has a field-effect transistor; an antenna which has a dielectric layer and a plurality of conductive layers sandwiching the dielectric layer; a battery; a conductive layer connecting the chip and the antenna, and a conductive layer connecting the chip and the battery. Note that the chip, the antenna, and the battery are mounted on a wiring substrate. Further, the chip and the battery are mounted at the opposite side of the antenna in the wiring substrate.

In addition, one feature of the present invention is a chip including a transistor which has a field-effect transistor; an antenna which has a dielectric layer and a plurality of conductive layers sandwiching the dielectric layer; a battery; a sensor device; a conductive layer connecting the chip and the antenna, a conductive layer connecting the chip and the battery, and the conductive layer connecting the chip and the sensor device. Note that the chip, the antenna, the sensor device and the battery are mounted on a wiring substrate. Further, the chip, the sensor device, and the battery are mounted at the opposite side of the antenna in the wiring substrate.

Note that the plurality of the conductive layers sandwiching the dielectric layer in the antenna functions as a radiating electrode and a ground contact body, respectively.

In addition, the dielectric layer of the antenna is formed with ceramics, organic resin, or a mixture of ceramics and organic resin. As a typical example of ceramics, alumina, glass, forsterite, barium titanate, lead titanate, strontium titanate, lead zirconate, lithium niobate, lead zirconium titanate, or the like can be nominated. In addition, as a typical example of a dielectric layer, epoxy resin, phenol resin, polybutadiene resin, bismaleimide triazine resin, vinylbenzyl, poly fumarate, or the like can be nominated.

One feature of the present invention is an electronic device having the above wireless chip. As a typical example of the electronic device, a liquid crystal display device, an EL display device, a television device, a mobile phone, a printer, a camera, a personal computer, a speaker device, a headphone, a navigation device, an ETC car-mounted device, an electronic key, and the like can be nominated.

In addition, since a patch antenna has high mechanical strength, it can be used repeatedly. Therefore, it is possible to provide a container, which has high durability and is recyclable like a returnable container, with the patch antenna.

In addition, the wireless chip having a sensor device can read data, which is detected by the sensor device, with a reader/writer. Therefore, it is possible to control quality data and storage situation of products.

In addition, a wireless chip having a battery can transmit a signal to a reader/writer automatically. In addition, the communication distance with the reader/writer can be lengthened.

In addition, a wireless chip having a battery and a sensor device can transmit data detected by the sensor device to the outside automatically. Therefore, the detected data can be stored in database in real time.

BRIEF DESCRIPTION OF DRAWINGS

In the accompanying drawings.

BEST MODE FOR CARRYING OUT THE INVENTION

Figure 1:
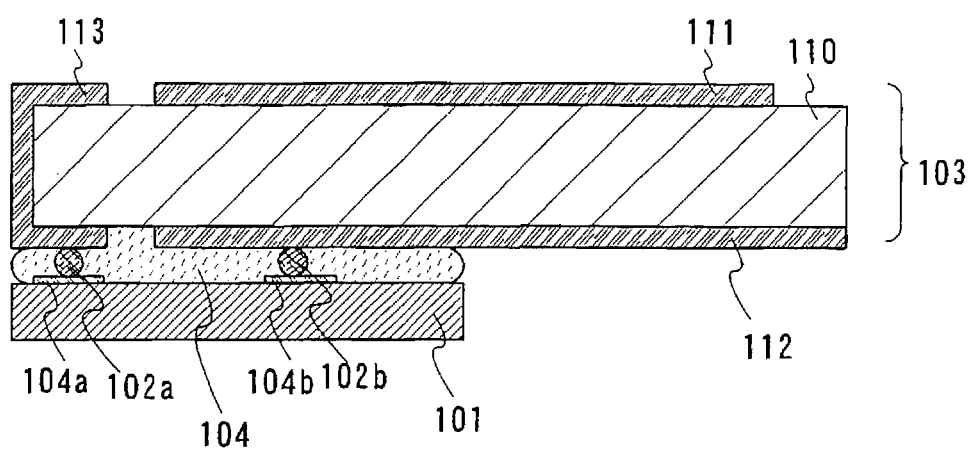
FIG. 1 is a cross-sectional diagram describing a wireless chip which is related to the present invention.

The embodiment modes of the present invention will be described hereinafter referring to the accompanying drawings. Note that the present invention can be performed in various modes, and it is easily understood by those skilled in the art that the embodiment modes and details herein disclosed can be modified in various ways without departing from the purpose and the scope of the invention. Therefore, the present invention should not be interpreted as being limited to the description of the embodiment modes to be given below. Note that, in all of the drawings for describing the embodiment mode, the same reference numeral is attached to the same portion or the portion having a similar function, and the repeated description thereof is omitted.

Embodiment Mode 1

A description is made on one embodiment mode of a wireless chip of the present invention referring to FIG. 1. FIG. 1 is a cross-sectional diagram of a wireless chip.

In a wireless chip of the present embodiment mode, a chip 101 having a field-effect transistor and an antenna (hereinafter, which is described as a patch antenna 103) are connected by conductive layers 102a and 102b. Concretely, a connection terminal 104a formed over the surface of the chip 101 having a field-effect transistor and a power feeding layer 113 of the patch antenna are connected by the conductive layer 102a. In addition, a connection terminal 104h formed over the surface of the chip 101 having a field-effect transistor and a conductive layer 112 functioning as a ground contact body of the patch antenna are connected by the conductive layer 102b. In addition, a connecting portion of the patch antenna 103 and the chip 101 having a field-effect transistor may be filled with an under fill 104.

The patch antenna 103 includes a dielectric layer 110; the first conductive layer 111 formed over a surface of the dielectric layer 110; the second conductive layer 112 which faces the first conductive layer 111 sandwiching the dielectric layer 110 and is formed over the other surface of the dielectric layer 110, and the power feeding layer 113. The first conductive layer 111 functions as a radiating electrode. The second conductive layer 112 functions as a ground contact body. The power feeding layer 113 is provided so that the first conductive layer 111 and the second conductive layer 112 are not touched with each other. In addition, power is supplied from the patch antenna to the chip having a field-effect transistor, or from the chip having a field-effect transistor to the patch antenna through the power feeding layer 113. Note that a power feeding point may be used instead of the power feeding layer 113.

Herein, a description is made on a structure of the patch antenna.

The dielectric layer 110 of the patch antenna can be formed with ceramics, organic resin or a mixture of ceramics and organic resin. As a typical example of ceramics, alumina, glass, forsterite, or the like can be nominated. Moreover, a plurality of ceramics may be mixed. The dielectric layer 110 is preferably formed with a ferroelectric material for obtaining a high dielectric constant. As a typical example of such a ferroelectric material, barium titanate ($BaTiO_3$), a lead titanate ($PbTiO_3$), strontium titanate ($SrTiO_3$), lead zirconate ($PbZrO_3$), lithium niobate ($LiNbO_3$), lead zirconium titanate (PZT), or the like can be nominated. Further, a plurality of ferroelectric materials may be mixed.

In addition, as organic resin, thermosetting resin or thermoplastic resin is used appropriately. As a typical example of organic resin, epoxy resin, phenol resin, polybutadiene resin, BT resin, vinylbenzyl, poly fumarate, fluoride resin or the like can be employed. Further, a plurality of organic resin materials may be mixed.

When the dielectric layer 110 is formed with a mixture of ceramics and organic resin, a particle of particulate ceramic is preferably dispersed in organic resin for forming the dielectric layer 110. At this time, the contained amount of the particulate ceramic to the dielectric layer 110 is preferably 20 volume % or more and 60 volume % or less. In addition, the particle size of ceramics is preferably 1 to 50 μm.

The relative dielectric constant of the dielectric layer 110 is 2.6 to 150, preferably 2.6 to 40. By using a ferroelectric material with a high relative dielectric constant, a volume of the patch antenna can be reduced.

The first conductive layer 111, the second conductive layer 112, the power feeding layer 113 of the patch antenna can be formed with a metal selected from gold, silver, copper, palladium, platinum, and aluminum or an alloy, or the like. In addition, the first conductive layer 111, the second conductive layer 112, the power feeding layer 113 of the patch antenna can be formed by a printing method, or a plating method. In addition, after a conductive film is formed over a dielectric layer by a vapor deposition method, a sputtering method, or the like, each conductive layer can be formed by etching a part of the conductive film.

A plane area of the patch antenna 103 is preferably to be several mm×several mm to several ten mm×several ten mm. Typical example is 7 mm×7 mm to 12 mm×12 mm. The thickness of the patch antenna is 1 mm to 15 mm, typically 1.5 mm to 5 mm. As for the shape of the patch antenna, plane surface of the patch antenna is preferably flat plate having a rectangular plane surface; however, it is not limited to this. A flat plate having a circular plane surface can be also used. Note that the plane surface here is one in which the first conductive layer functioning as a radiating electrode or the second conductive layer functioning as a ground contact body is formed.

A description is made on a structure of a patch antenna referring to FIGS. 5A to 5D.

Figure 5:
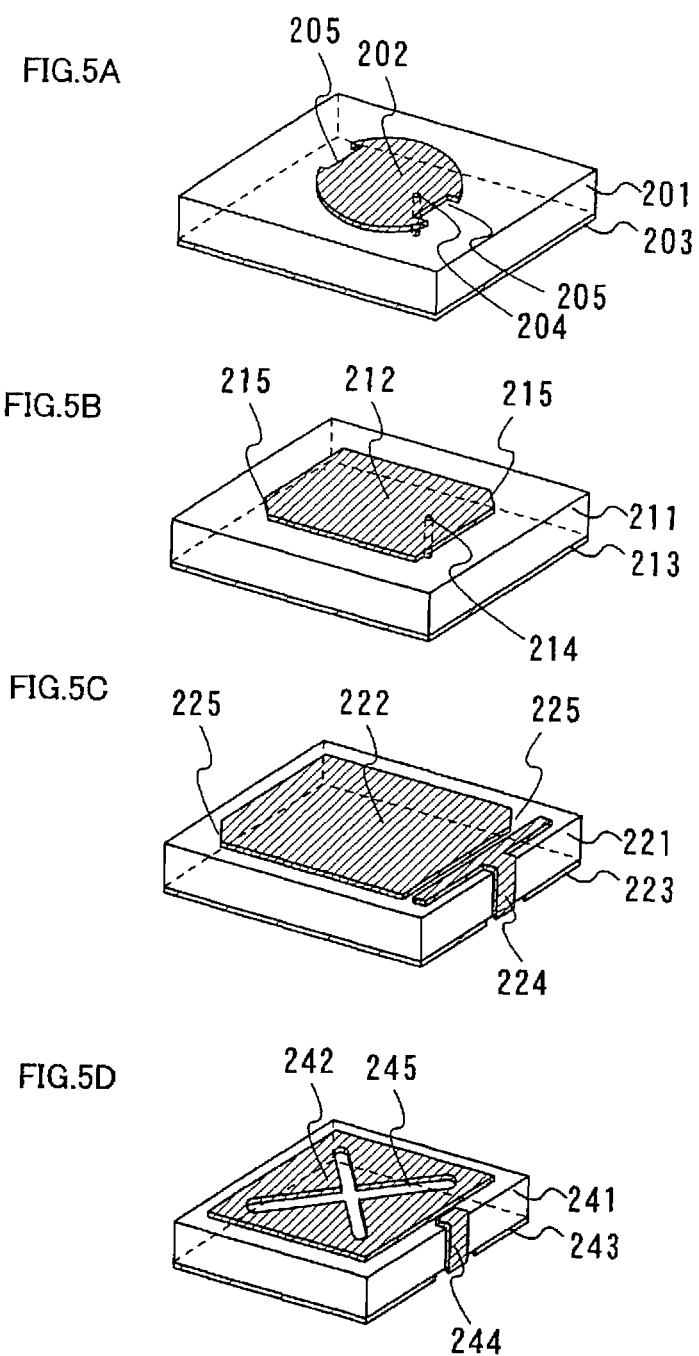
FIG. 5A to 5D are perspective views describing a patch antenna which is applicable to the present invention.

FIG. 5A shows a patch antenna having a first conductive layer 202 functioning as a radiating electrode; a dielectric layer 201; a second conductive layer 203 functioning as a ground contact body; a power feeding point 204, and a power feeder which is formed in the through hole provided in the first conductive layer 202, the dielectric layer 201, and the second conductive layer 203, and is connected to the power feeding point 204. Note that the power feeder is connected to the first conductive layer 202 in the power feeding point 204; however, it is not connected to the second conductive layer 203. When the first conductive layer 202 functioning as a radiating electrode is a circular shape and a degenerate separation element 205 presents in two regions which are symmetric about a point with each other, the patch antenna is a circularly-polarized wave antenna. Meanwhile, the first conductive layer 202 is a circular shape, the patch antenna is a linearly-polarized wave antenna.

FIG. 5B shows a patch antenna having a first conductive layer 212 functioning as a radiating electrode; a dielectric layer 211; a second conductive layer 213 functioning as a ground contact body; a power feeding point 214, and a power feeder which is formed in the through hole provided in the first conductive layer 212, the dielectric layer 211, and the second conductive layer 213, and is connected to the power feeding point 214. Note that the power feeding body is connected to the first conductive layer 212 in the power feeding point 214; however, it is not connected to the second conductive layer 213. When the first conductive layer 212 functioning as a radiating electrode is rectangular and a degenerate separation element 215 presents in two corners which are symmetric about a point with each other, the patch antenna is a circularly-polarized wave patch antenna. When the first conductive layer 212 is a rectangular shape, the patch antenna is a linearly-polarized wave patch antenna.

FIG. 5C describes a patch antenna having a first conductive layer 222 functioning as a radiating electrode; a dielectric layer 221; a second conductive layer 223 functioning as a ground contact body, and a power feeding layer 224. When the first conductive layer 222 functioning as a radiating electrode is rectangular and a degenerate separation element 225 presents in two corners which are symmetric about a point with each other, it is a circularly-polarized wave patch antenna. In the case where the first conductive layer 222 is a rectangle having no a degenerate separation element 225, the patch antenna is a linearly-polarized wave patch antenna. The first conductive layer 222 functioning as a radiating electrode and power feeding layer 224 are capacitance-coupled through a gap. Since the power feeding layer 224 is formed on side surface of the dielectric layer, surface mounting is possible.

Since the patch antennas shown in FIG. 5A to 5C have the second conductive layers 203, 213, and 223 functioning as a ground contact body to one surface of the dielectric layers 201, 211, and 221, they have a directivity at the side of the first conductive layers 202, 212, and 222. Thus, electric wave is emitted to the side of the first conductive layers.

FIG. 5D is a patch antenna having a first conductive layer 242 functioning as a radiating electrode; a dielectric layer 241; the second conductive layer 243 functioning as a ground contact body, and a power feeding layer 244. In addition, as shown in FIG. 5D, an orthogonal slits 245 are formed diagonally in the first conductive layer 242. In other words, crisscross cutouts are provided in the first conductive layer 242 functioning as a radiating electrode. Therefore, the dielectric layer 241 is exposed in the crisscross part. The first conductive layer 242 functioning as a radiating electrode and the power feeding layer 244 are capacitance-coupled through a gap. As a typical example of the patch antenna having such a shape, CABPB1240, CABPB0730, CABPB0715 (a product manufactured by TDK) can be nominated. Since the power feeding layer 244 is formed over the side surface of the dielectric layer 241, surface mounting is possible. The patch antenna having such a structure has no directivity due to the orthogonal slits of the first electrode layer 242 functioning as a radiating electrode, and thus, an electric wave can be emitted in all directions. Therefore, mounting place or setting angle may not be decided. Thus, the degree of freedom can be increased in designing electric devices.

In addition, a known patch antenna can be used besides the patch antenna shown in FIG. 5A to 5D.

In particular, by using a patch antenna of circularly-polarized wave, it is possible to carry out transmission/reception such as third-generation data communication, packet communication, and transmission/reception of GPS (Global Positioning System (1.5 GHz)), satellite digital broadcast (2.6 GHz), PAN (a personal area network) such as wireless LAN (Local Area Network) (2.4 GHz, 5.2 GHz), a wireless communication technology for connecting information appliances (Bluetooth (trademark) (2.4 GHz)), or UWB (Ultra Wide Band) (3 to 10 GHz), and the like.

Figure 4:
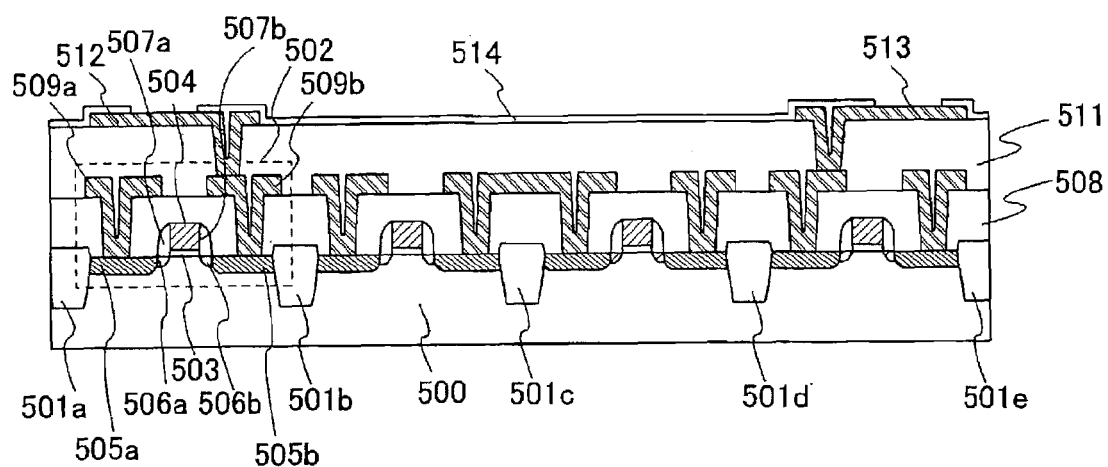
FIG. 4 is a cross-sectional diagram describing a chip having an effect of a field-effect transistor related to the present invention.

A description is made on the chip 101 having a field-effect transistor referring to FIG. 4.

FIG. 4 describes a cross-sectional diagram of the chip 101 having a field-effect transistor. Element isolation regions 501a to 501e are formed over a substrate 500, and a field-effect transistor 502 is formed between each of the element isolation regions 501a to 501e.

The field-effect transistor 502 includes a gate insulating film 503 formed over a single crystal semiconductor substrate, a gate electrode 504 formed over the gate insulating film, source and drain regions 505a and 505b in the single crystal semiconductor substrate, an interlayer insulating layer 508 formed over the gate electrode, and source and drain wirings 509a and 509b connected to the source and drain regions 505a and 505b. Note that sidewalls 507a and 507b, which are formed at the side wall of the gate electrode 504 and the gate insulating film 503, or low concentration impurity regions 506a and 506b, which are covered by the sidewalls 507a and 507b in the single crystal semiconductor substrate, may be included.

A substrate 500 is a single crystalline semiconductor substrate or a compound semiconductor substrate. As a typical example, an n-type or p-type single crystalline silicon substrate, a GaAs substrate, an InP substrate, a GaN substrate, a SiC substrate, a sapphire substrate, a ZnSe substrate or the like can be nominated. Alternatively, an SOI substrate (Silicon On Insulator) can be used. In this embodiment mode, an n-type single crystalline silicon substrate is used as the substrate 500.

The element isolation regions 501a to 501e are formed by a known method such as a LOCOS (Local Oxidation of Silicon) method or a trench isolation method, appropriately. Herein, a silicon oxide layer is formed by the trench isolation method as the element isolation regions 501a to 501e.

The gate insulating film 503 is formed by thermally oxidizing the single crystalline semiconductor substrate. The gate electrode 504 can be a polycrystalline silicon layer with a thickness of 100 to 300 nm, or a stacked structure including a silicide layer such as a tungsten silicide layer, a molybdenum silicide layer, and a cobalt silicide layer formed over the polycrystalline silicon layer. Moreover, a nitride tungsten layer and a tungsten layer may be stacked over the polycrystalline silicon layer.

For the source and drain regions 505a and 505b, an $n^+$ region in which phosphorus is added to a p-well region or a $p^+$ region in which boron is added to an n-well region can be used. For the low concentration impurity regions 506a and 506b, an $n^-$ region in which phosphorus is added to a p-well region or a $p^-$ region in which boron is added to an n-well region can be used. Herein, since an n-type single crystalline silicon substrate is used, source and drain regions of a $p^+$ region, which are formed by adding boron to a substrate, and a low concentration impurity region of a p⁻ region are formed. Note that silicide such as manganese silicide, tungsten silicide, titanium silicide, cobalt silicide, and nickel silicide may be included in the source and drain regions 505a and 505b. By having silicide in the surface of the source and drain regions, connection resistance of the source and drain wirings and the source and drain regions can be reduced.

Sidewalls 507a and 507b form an insulating layer which is formed with silicon oxide by a CVD method over a substrate, and they can be formed by anisotropically etching the insulating layer with an RIE (Reactive ion etching) method.

The interlayer insulating layer 508 is formed with an inorganic insulating material such as silicon oxide and silicon nitride oxide, or an organic insulating material such as acryl resin and polyimid resin. In the case where a coating method such as a spin-coating method and a roll coater is used, the insulating layer which is formed with silicon oxide by a thermal treatment can be used after an insulating film material dissolved in an organic solvent is coated. Herein, the interlayer insulating layer 508 is formed with silicon oxide.

Source and drain wirings 509a and 509b are preferably formed by combining a low resistor material such as aluminum (Al) and a barrier metal used a metal material with a high melting point such as titanium (Ti) and molybdenum (Mo). Concretely, a stacked structure of titanium (Ti) and aluminum (Al) and a stacked structure of molybdenum (Mo) and aluminum (Al) can be nominated.

The chip 101 having the field-effect transistor may include a resistor element, a capacitor, or the like, besides the field-effect transistor.

An interlayer insulating layer 511 is formed over the interlayer insulating layer 508, and the source and drain wirings 509a and 509b. The interlayer insulating layer 511 is formed in the same manner as the interlayer insulating layer 508. Connection terminals 512 and 513 which are connected to the field-effect transistor 502 are provided over the interlayer insulating layer 508.

An insulating layer 514 which covers a part of the connection terminals 512 and 513 and the interlayer insulating layer 511 may be formed. Since the insulating layer 514 functions as a protection layer, it is preferably formed with nitride silicon, oxide silicon, silicon nitride oxide, silicon oxynitride, DLC (diamond like carbon), or the like.

Conductive layers 102a and 102b which connects the patch antenna 103 and the chip 101 having a field-effect transistor are formed with a bump, a conductive paste, an anisotropic conductive adhesive, an anisotropic conductive film, or the like. Alternatively, a bump and a conductive paste may be used. Moreover, a bump and an anisotropic conductive adhesive, or a bump and an anisotropic conductive film may be used. In the cases, the conductive layer and the connection terminal are connected by the bump and the conductive particle.

An anisotropic conductive film and an anisotropic conductive adhesive are adhesive organic resin in which conductive particles of particle size of several nm to several μm are diffused. As organic resin, epoxy resin, phenolic resin, or the like can be nominated. The conductive particle is formed with one or more elements selected from gold, silver, copper, palladium, or platinum. Alternatively, a particle having a multilayer structure of these elements may be used. Further, a conductive particle whose surface is coated with a thin film formed with one or more metals selected from gold, silver, copper, palladium, or platinum may be used. The particle is formed with resin.

The under fill 104 has a function to reinforce a connection portion of the chip 101 having a field-effect transistor and the patch antenna 103, and to prevent water from entering from outside, or the like. The under fill 104 is formed with epoxy resin, acrylic resin, polyimid resin, or the like.

Figure 6:
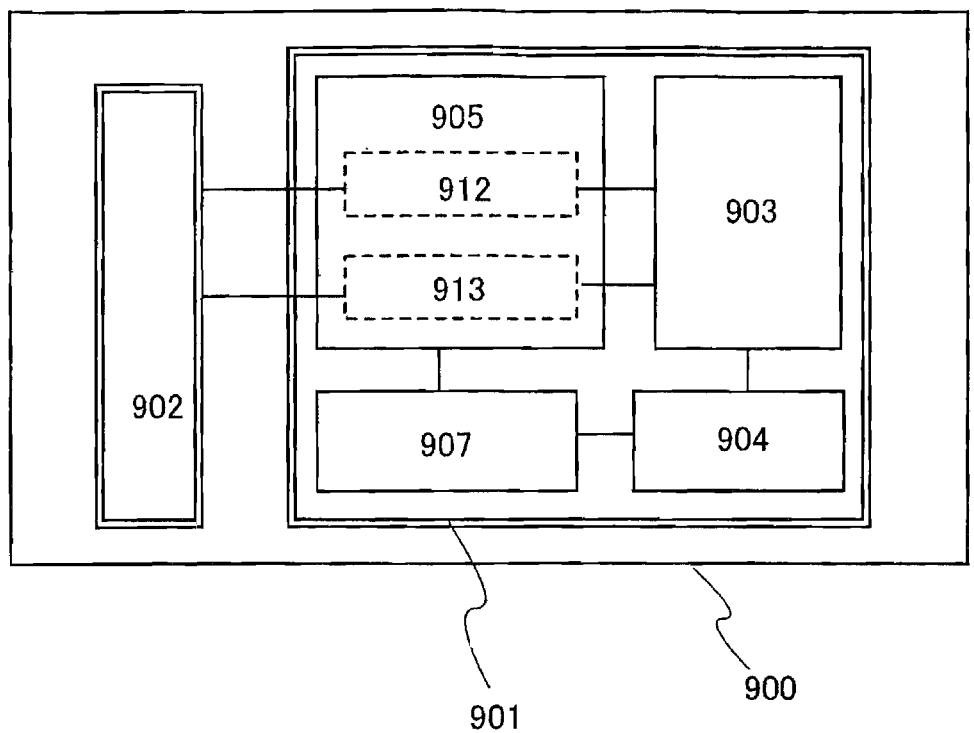
FIG. 6 is a diagram describing a wireless chip which is related to the present invention.

A description is made on a structure of a wireless chip 900 shown in the present embodiment mode referring to FIG. 6. The wireless chip 900 of the present embodiment mode includes a chip 901 having a field-effect transistor and an antenna 902.

The chip 901 having a field-effect transistor includes an arithmetic processing circuit portion 903, a memory portion 904, a communication circuit portion 905, and a power supply portion 907. The memory portion 904 includes a memory for only reading, or one or both of rewritable memory. The memory portion 904 is formed with one or more selected from a static RAM, an EEPROM (Electrically Erasable Programmable Read-Only Memory), a flash memory, and an organic memory, so that the received data from the outside through the antenna 902 can be recorded anytime.

Note that an organic memory is such that a layer having an organic compound is provided between a pair of electrodes. Further, an organic memory is such that a mixed layer of an organic compound and an inorganic compound is provided between a pair of electrodes. As a typical example of an organic compound, a material whose crystalline state, conductivity, or shape is changed by applying voltage or emitting light can be nominated. Typically, a conjugated polymer doped with a compound that generates acid by absorbing light (photooxidation generating agent), an organic compound having a hole transporting property, or an organic compound having an electron transporting property can be used.

Since the organic memory can realize reduction in its size and thickness, and increase its capacity simultaneously, a wireless chip can achieve reduction in its size and weight by providing the memory portion 904 using an organic memory.

Note that the structure of the memory portion 904 may be formed to make it possible to write anytime. In addition, the memory portion 904 may have a memory element of a floating gate structure in which data is not disappeared. Especially, it is possible to utilize a memory element which has a floating gate structure and in which data can be written only once. By simplifying the function, the size of a wireless chip can be reduced. Further, reduction in power consumption is also achieved.

The communication circuit portion 905 includes a demodulation circuit 912 and a modulation circuit 913. The demodulation circuit 912 demodulates a signal which is inputted through the antenna 902, and outputs to the arithmetic processing circuit portion 903. The signal includes data to be memorized in the memory portion 904. The data read from the memory portion 904 is outputted to the modulation circuit 913 through the arithmetic processing circuit portion 903. The modulation circuit 913 modulates the signal into a signal which is acceptable for wireless communication, and outputs to an external device through the antenna 902.

The electric power required for operating the arithmetic processing circuit portion 903, the memory portion 904, and the communication circuit portion 905 is supplied through the antenna 902.

The antenna 902 receives an electromagnetic wave which is supplied from the external device called as a reader/writer, and a required electric power is generated in a power supply circuit portion 907. The antenna 902 is appropriately designed in accordance with a frequency band to be communicated. The frequency band of the electromagnetic wave is long waveband in the range of 30 to 135 kHz, short waveband in the range of 6 to 60 MHz (typically 13.56 MHz), ultrashort wave band in the range of 400 to 950 MHz, micro wave band in the range of 2 to 25 GHz, or the like can be used. For antennas of the long wave band and short wave band, one which utilizes electromagnetic induction by a loop antenna is used. In addition, one which utilizes a mutual induction effect (electromagnetic coupling type) or an induction effect due to static (electrostatic coupling type) may be used. Electric power is generated in the power supply circuit portion 907. The antenna 902 may be provided by separating a data communication antenna and a power supply antenna.

The patch antenna 103 shown in FIG. 1 can be used for the antenna 902 shown in FIG. 6, and the chip 101 having a field-effect transistor shown in FIG. 1 can be used for the chip 901 having a field-effect transistor shown in FIG. 6. As a result, durability of a wireless chip is increased.

Embodiment Mode 2

Figure 2:
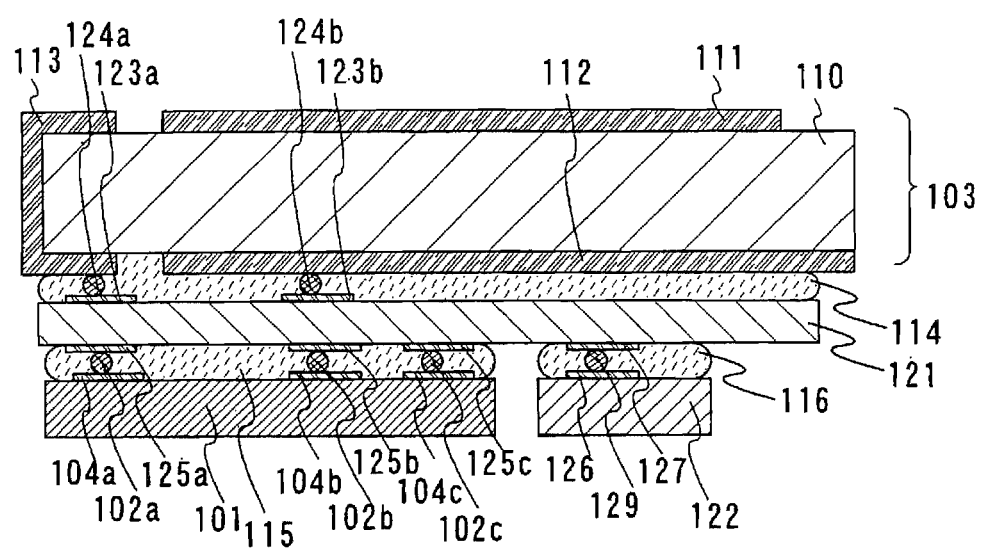
FIG. 2 is a cross-sectional diagram describing a wireless chip which is related to the present invention.

A description is made on one embodiment mode of a wireless chip of the present invention referring to FIG. 2. FIG. 2 is a cross-sectional diagram of a wireless chip. In the present embodiment mode, description is made on a structure of a wireless chip including a chip having a field-effect transistor, a patch antenna, and a sensor device.

The chip 101 having a field-effect transistor is mounted on a wiring substrate 121, in the wireless chip of the present embodiment mode. Specifically, connection terminals 104a to 104c formed over the surface of the chip 101 having a field-effect transistor and connection terminals 125a to 125c formed over the wiring substrate 121 are connected by conductive layers 102a to 102c, respectively.

A sensor device 122 is mounted over the wiring substrate 121. Specifically, a connection terminal 126 formed over the surface of the sensor device 122 and a connection terminal 127 formed over the wiring substrate 121 are connected by a conductive layer 129.

The connection terminals 125a to 125c and the connection terminal 127 formed over the wiring substrate 121 are connected by a wiring and a conductive layer formed in a via hole, a through hole, or the like, which are formed over the wiring substrate 121. In other words, the chip 101 having a field-effect transistor and the sensor device 122 are connected electrically.

The patch antenna 103 is mounted over the wiring substrate 121. Specifically, the power feeding layer 113 of the patch antenna 103 and a connection terminal 123a formed over the wiring substrate 121 are connected by a conductive layer 124a, and the conductive layer 112 functioning as a ground contact body of the patch antenna and a connection terminal 123b formed over a wiring substrate are connected by a conductive layer 124b.

The connection terminals 123a and 125a are connected by a conductive layer formed in the via hole, the through hole or the like of the wiring substrate 121, which is not shown in figure. In the same manner, the connection terminal 123b and the connection terminal 125b are connected by the conductive layer formed over the via hole, the through hole or the like of the wiring substrate 121, respectively. In other words, the chip 101 having a field-effect transistor and the patch antenna 103 are electrically connected.

Herein, the patch antenna 103 and the chip 101 having a field-effect transistor are mounted at the opposite side of the wiring substrate 121. Thus, the connection terminals 123a and 123b are formed over one face of the wiring substrate 121, and the connection terminals 125a and 125b are formed over the other face of the wiring substrate 121. However, the connection terminals 123a and 123b and the connection terminals 125a and 125b may be formed over one face of the wiring substrate 121, and the chip 101 having a field-effect transistor and the patch antenna 103 may be formed over the other face of the wiring substrate.

The wiring substrate 121 is a plate-like substrate or a flexible substrate. In addition, the wiring substrate 121 employs a multilayer wiring substrate having a plurality of wiring layers in the substrate. As a hard wiring substrate, a substrate which is formed with glass epoxy resin, ceramics, alumina, nitride alumina, or the like can be nominated. As a flexible wiring substrate, a substrate which is formed with polyimide such as a TAB (Tape Automated Bonding) substrate or a FPC (flexible printed substrate), or the like, typically can be nominated.

The connection terminals 123a, 123b, 125a to 125c, and 127 formed over the wiring substrate 121 are formed with copper, gold, or the like. Each of the connection terminals is connected to a wiring formed over the surface or inside the wiring substrate 121.

The connection portion of the patch antenna 103 and the wiring substrate 121, the connection portion of the chip 101 having a field-effect transistor and the wiring substrate 121, and the connection portion of the sensor device 122 and the wiring substrate 121 may be filled with under fills 114 to 116.

The conductive layers 102c, 124a and 124b, and the conductive layer 129 are formed in the same manner as the conductive layers 102a and 102b shown in Embodiment Mode 1. In addition, the under fills 114 to 116 are formed in the same manner as the under fill 104 shown in Embodiment Mode 1.

Figure 7:
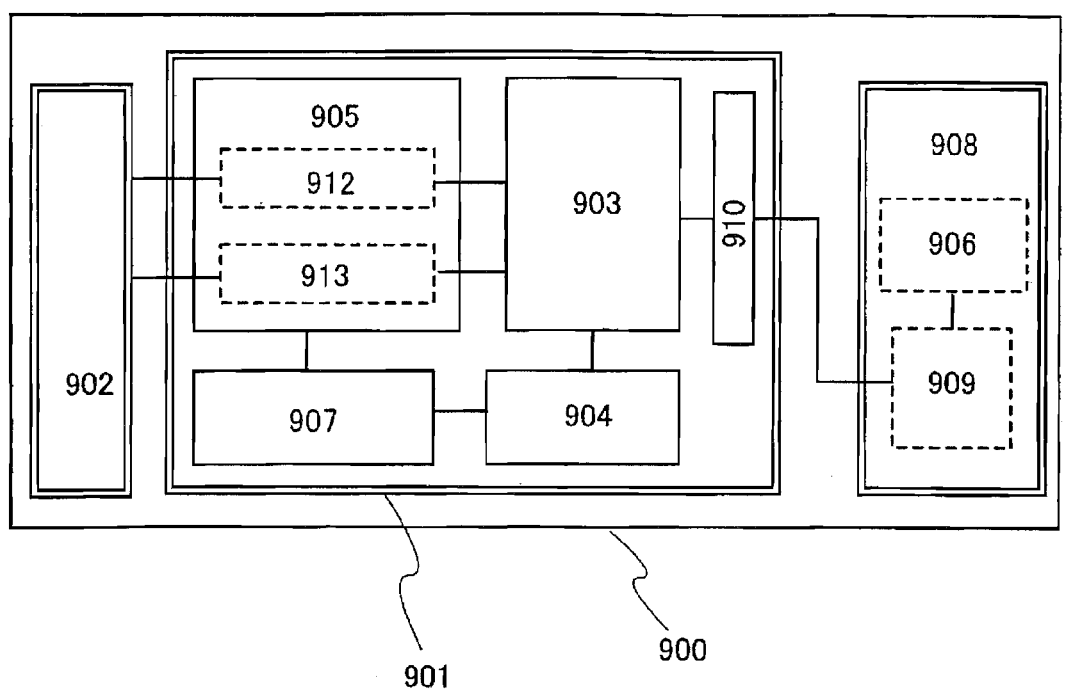
FIG. 7 is a diagram describing a wireless chip which is related to the present invention.

Herein, a description is made on a structure of a wireless chip of the present invention referring to FIG. 7. The wireless chip of the present embodiment mode includes a sensor device 908 which is connected to a arithmetic processing circuit portion 903 through a bus 910, in addition to the wireless chip shown in Embodiment Mode 1. In addition, The sensor device 908 includes a sensor element 906 and a sensor circuit 909.

As the sensor device, a device which can detect temperature, pressure, flow rate, light, magnetism, acoustic wave, acceleration, humidity, gas component, liquid component, or the other characteristics by a physical or chemical method is used. The sensor device 908 includes the sensor element 906 and the sensor circuit 909 which controls the sensor element 906. The sensor element 906 is formed with an element such as a low resistor element, a capacitance-coupled element, an inductively-coupled element, a photoelectromotive element, a photoelectric conversion element, a thermoelectromotive element, a transistor, a thermistor, a diode, an electrostatic capacitance element, and a piezoelectric element. Note that a plurality of the sensor elements 906 may be provided. In this case, a plurality of physical quantities and chemical quantities can be detected concurrently.

Note that the physical quantity here means temperature, pressure, flow rate, light, magnetism, acoustic wave, acceleration, humidity, and the like, while the chemical quantity means a chemical material such as a gas component like gas, and a liquid component like ion. The chemical quantity means also an organic compound such as a particular biological material included in blood, sweat, urine, or the like, (for example, blood glucose level or the like in blood) besides the above. In particular, in the case of detecting the chemical quantity, since a certain material need to be selectively detected, a material which selectively reacts with the material to be detected is provided in advance in a detecting element 31. For example, in the case of detecting a biological material, it is preferable to fix, in a polymer molecule or the like, enzyme, a resistor molecule, a microbial cell, or the like which selectively react with the biological material to be detected by the detecting element 31. Herein, an optical sensor which is formed with a single crystalline silicon is used as the sensor element 906.

The sensor circuit 909 detects an impedance, a reactance, an inductance, and a change of voltage or current, and carried out an analogue/digital conversion (A/D conversion) to output signals into the arithmetic processing circuit portion 903.

The data detected by the sensor device 908 is outputted to each of modulation circuits 913 through the bus 910 and the arithmetic processing circuit portion 903. The modulation circuit 913 modulates the signal into a signal which is acceptable for wireless communication, and outputs to an external device via an antenna 902.

Note that it is possible to combine the present embodiment mode and the Embodiment Mode 1, appropriately.

The wireless chip of the present embodiment mode can transmit data detected by the sensor device to the outside. Further, the wireless chip of the present embodiment mode can convert data detected by the sensor device into a signal and transmit the signal to a reader/writer through the antenna. Thus, confidentiality can be increased. In addition, since data detected by the sensor can be stored in a memory portion, a device having a sensor function can be reduced in its size.

Embodiment Mode 3

Figure 3:
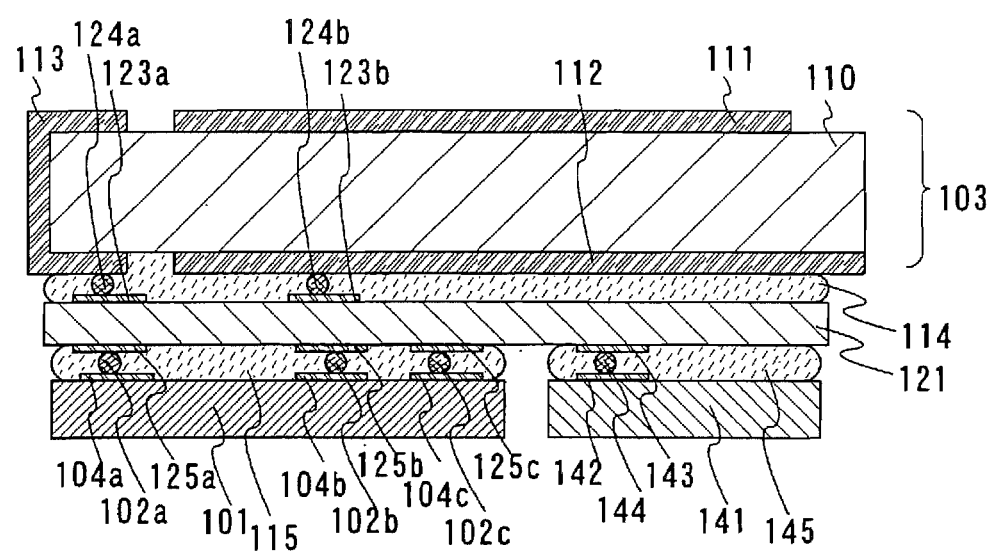
FIG. 3 is a cross-sectional diagram describing a wireless chip which is related to the present invention.

A description is made on one embodiment mode of a wireless chip of the present invention referring to FIG. 1. FIG. 3 is a cross-sectional diagram of the wireless chip.

The wireless chip of the present embodiment mode is one in which a battery is added to the wireless chip shown in Embodiment Mode 1. Specifically, the connection terminals 104a to 104c formed over the surface of the chip 101 having a field-effect transistor and the connection terminals 125a to 125c formed over the wiring substrate 121 are connected by the conductive layers 102a to 102c, respectively.

A battery 141 is mounted over the wiring substrate 121. Specifically, a connection terminal 142 formed over the surface of the battery 141 and a connection terminal 143 formed over the wiring substrate 121 are connected by a conductive layer 144.

Note that the connection terminals 125a to 125c formed over the wiring substrate 121 and the connection terminal 143 are connected by the conductive layer such as the wiring, the via hole, and the through hole formed over the wiring substrate. In other words, the chip 101 having a field-effect transistor and the battery 141 are connected. Specifically, a power supply circuit portion 907 of the chip 101 having a field-effect transistor and the battery 141 are connected.

The patch antenna 103 is mounted over the wiring substrate 121. Specifically, the power feeding layer 113 of the patch antenna 103 and the connection terminal 123a formed over the wiring substrate 121 are connected by the conductive layer 124a. The conductive layer 112 functioning as the ground contact body of the patch antenna and the connection terminal 123b formed over the wiring substrate are connected by the conductive layer 124b. In other words, the chip 101 having a field-effect transistor and the patch antenna 103 are connected.

The battery 141 is preferably compact size, more preferably sheet-like with a thickness of 0.5 mm or less and 0.1 mm or more. Moreover, the battery is preferably square-shaped for being easily manufactured; however, it may be circular, oval, or polygonal. Further, the battery 141 may be a primary battery or a secondary battery. The battery 141 can be reduced in its size by using a lithium battery, preferably a lithium polymer battery which utilizes a gel-like electrolyte, an organic radical battery which utilizes a gel-like electrolyte, and a lithium ion battery or the like.

In the case where the battery 141 is a secondary battery, it is preferable to provide the wiring substrate 121 with a device having a photoelectromotive effect such as a solar battery using a single crystalline silicon or an amorphous silicon, and a dye-sensitised solar cell. Alternatively, a piezoelectric element which converts energy generated by load or exercise into an electric signal due to a piezoelectric effect may be provided.

The connection portion of the patch antenna 103 and the wiring substrate 121, the connection portion of the chip 101 having a field-effect transistor and the wiring substrate 121, and the connection portion of the battery 141 and the wiring substrate 121 may be filled with under fills 114 to 116.

Note that it is possible to combine the present embodiment mode and the Embodiment Mode 1, appropriately. In addition, the battery 141 may be added to the wireless chip having a sensor device as shown in Embodiment Mode 2.

The wireless chip having the battery 141 can transmit a signal to a reader/writer automatically.

Embodiment 1

Figure 11A:
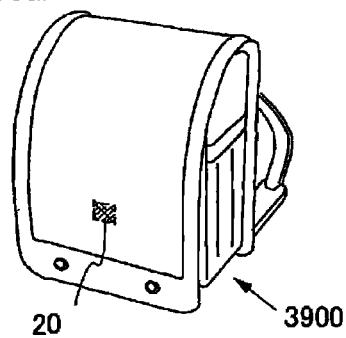
FIG. 11A to 11G are diagrams describing an application of a wiring chip of the present invention.
Figure 11B:
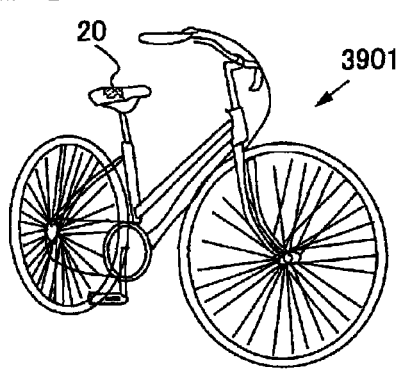
Figure 11C:
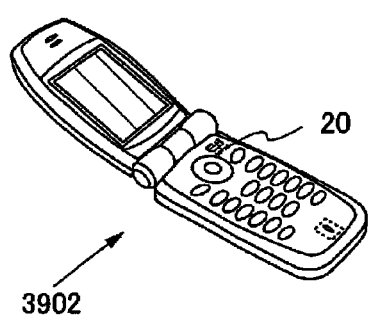
Figure 11D:
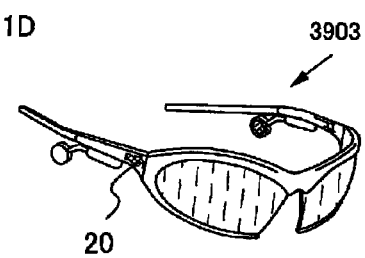
Figure 11E:
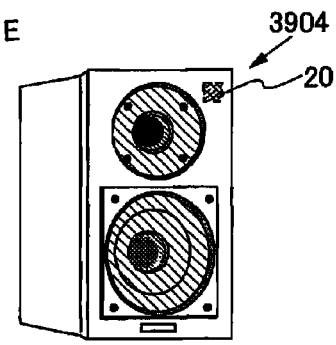
Figure 11F:
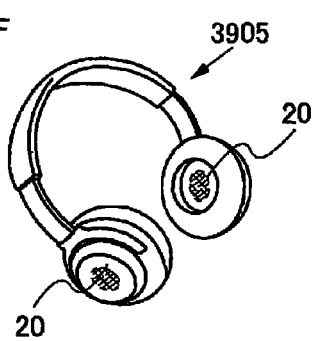
Figure 11G:
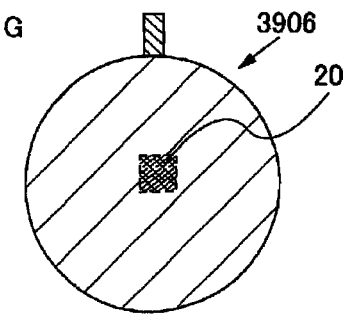

The usage of the wireless chip of the present invention is broad. For example, a wireless chip 20 can be use by mounting on products such as vehicles (for example, a bicycle 3901 shown in FIG. 11B, and a car); groceries; plants; clothes; livingwares (for example, a bag 3900 shown in FIG. 11A); an electronic device; an inspection apparatus; and a fireworks ball (reference: FIG. 11G), animals, and human body. The electronic device includes a liquid crystal display device, an EL (Electro Luminescence) display device, a television device (which is simply called as a TV, a TV receiver, a television receiver), a mobile phone 3902 (reference: FIG. 11C), a printer, a camera, a personal computer, a goggle with a earphone 3903 (reference: FIG. 11D), a speaker device 3904 (reference: FIG. 11E), a headphone 3905 (reference: FIG. 11F), a navigation device, an ETC (Electronic Toll Collection system: automatic toll collection system for toll roads) car-mounted device, an electronic key, or the like.

By providing the wireless chip 20 of the present invention on the bag 3900, the bicycle, 3901, or the like, it is possible to detect the location of those products with a GPS. As a result, it is possible to localize a stolen bicycle. Moreover, it is possible to facilitate research of a missing person.

By providing the wireless chip 20 of the present invention on the mobile phone 3902, transmission/reception of data, and phone communication become possible.

Moreover, by providing the wireless chip of the present invention on the goggle with an earphone 3903, the speaker device 3904, or the headphone 3905, music played with an audio device can be listened without connecting the audio device and the electronic device with a code. A compact hard disc (a memory device) may be included in the goggle with an earphone 3903 besides the wireless chip 20. In the case where the wireless chip 20 includes a central processing unit, since an audio signal coded by an audio device can be received, demodulated, and amplified by the goggle with an earphone 3903, the headphone 3905, or the speaker device 3904, sound can be listened with a high confidentiality. Further, the goggle with an earphone 3903 or the headphone 3905 can be easily worn since it is codeless, the speaker 3904 can be easily set. In this case, it is preferable to provide a battery on the goggle with an earphone and the speaker device.

By providing the wireless chip 20 of the present invention on the fireworks ball 3906, it is possible to carry out quality management. Specifically, by providing the wireless chip 20 having a sensor device in the powder filled inside of the fireworks ball or on the surface of the fireworks ball, data such as humidity, temperature, or the like of the fireworks ball which is detected by the sensor device can be transmitted to a reader/writer. As a result, it is possible to prevent setting off a damp fireworks ball, besides quality management of a fireworks ball, and thus, an accident due to a drop of an unexploded fireworks ball can be prevented.

The wireless chip of the present invention is fixed to products by mounting on a print substrate, attaching to the surface, or embedding. For example, in the case of a package formed with organic resin, the wireless chip is embedded in the organic resin. By providing the wireless chip on products such as foods; plants; clothes; livingwares; and an electronic device, animals and human body, efficiency of system such as a detecting system and a testing system can be promoted.

Figure 12:
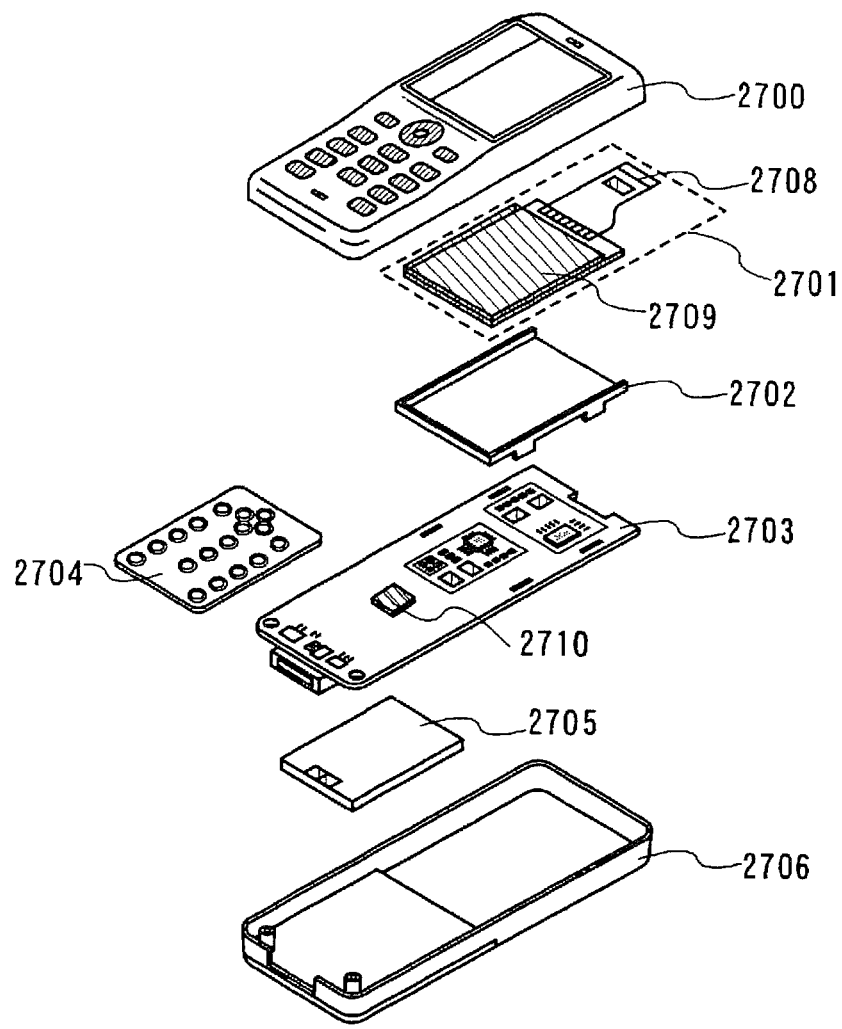
FIG. 12 is a projected diagram describing an application of a wiring chip of the present invention.

Next, a description is made on one mode of an electronic device in which the wireless chip of the present invention is mounted referring to a figure. The electronic device shown here is a mobile phone, which includes cases 2700 and 2706, a panel 2701, a housing 2702, a print wiring substrate 2703, operating buttons 2704, and a battery 2705 (reference: FIG. 12). The panel 2701 is incorporated in the housing 2702, which is easily peeled off, and the housing 2702 is attached to the print wiring substrate 2703. The shape and size of the housing 2702 is changed appropriately in accordance with the electronic device to which the panel 2701 is incorporated. A plurality of semiconductor devices, which are packaged, and a wireless chip 2710 of the present invention are mounted on the print wiring substrate 2703.

The panel 2701 is connected to the print wiring substrate 2703 through a connection film 2708. The above panel 2701, the housing 2702, and the print wiring substrate 2703 are incorporated in the cases 2700 and 2706, besides the operating buttons 2704 and the battery 2705. A pixel region 2709 included in the panel 2701 is positioned so as to be recognized from the opening provided in the case 2700.

Note that the cases 2700 and 2706 are description shown as one example of an external appearance of a mobile phone, and the electronic devices which are related to the present invention can be changed into various mode in accordance with its function and its usage.

Figure 14:
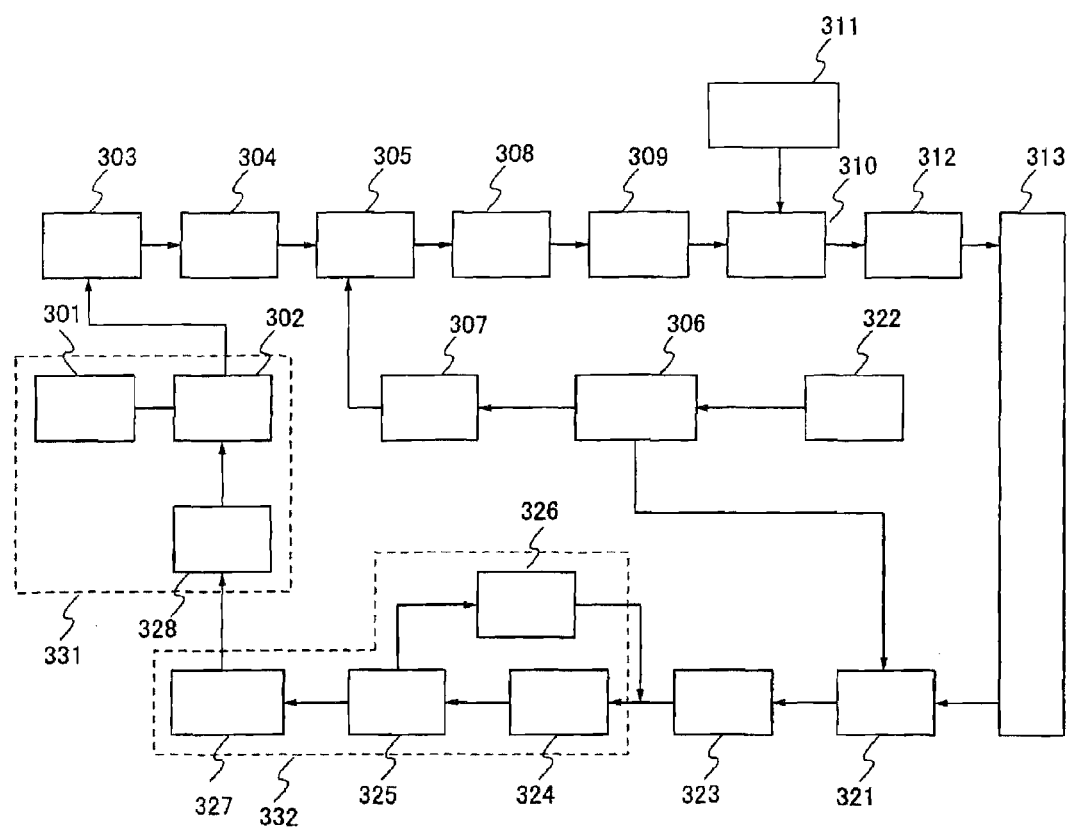
FIG. 14 is a diagram describing a high frequency circuit which is applicable to the present invention.

Herein, a description is made on a block diagram of a high-frequency circuit represented by a data demodulation and modulation circuit of a mobile phone referring to FIG. 14.

First, a description is made on a process of transmitting a signal, which is received by an antenna, into a base band unit. The received signal inputted into an antenna 301 is inputted from a duplexer 302 into a low noise amplifier (LNA) 303 and amplified to be a prescribed signal. The received signal inputted into the low noise amplifier (LNA) 303 passes a band pass filter (BPF) 304 to be inputted into a mixer 305. An RF signal is inputted from a hybrid circuit 306 into the mixer 305, and the RF signal component is removed in the band pass filter (BPF) 307 to be demodulated. The received signal outputted from the mixer 305 is amplified in an amplifier 309 after passing a SAW filter 308, and inputted into a mixer 310. A local oscillation signal of a prescribed frequency is inputted from a local oscillator circuit 311 to the mixer 310, converted into a desirable frequency, and amplified into a prescribed level by an amplifier 312. Then the signal is transmitted into a base band unit 313. The antenna 301, the duplexer 302, and a low pass filter 328 are described as an antenna front end module 331.

Next, a description is made on a process of transmitting a signal with an antenna, which is transmitted from a base band unit. The transmitted signal from the base band unit 313 is mixed with an RF signal from the hybrid circuit 306 by a mixer 321. The hybrid circuit 306 is connected a voltage control transmission circuit (VCO) 322, and thus, an RF signal of a prescribed frequency is supplied.

The transmitted signal, to which an RF modulation is performed by the mixer 321, is amplified by a power amplifier (PA) 324, after passing a band pass filter (BPF) 323. A part of the output by the power amplifier (PA) 324 is taken out from a coupler 325, and adjusted into a prescribed level by an attenuator (APC) 326. Then, the output is inputted into the power amplifier (PA) 324 again, and adjusted so as to stabilize the gain of the power amplifier (PA) 324. The transmitted signal from the coupler 325 is inputted into the duplexer 302, after passing an isolator 327 for backflow prevention and a low pass filter (LPF) 328, and transmitted from the antenna 301 to which is connected with the duplexer 302. Note that the attenuator (APC) 326, the power amplifier (PA) 324, the coupler 325, and the isolator 327 are described as an isolator power amplifier module 332.

The wireless chip of the present invention can reduce its number of components, since the chip includes a high-frequency circuit represented by the above modulation and demodulation circuit and an antenna. Since the number of the components mounted on a wiring substrate can be reduced, it is possible to reduce the area of the wiring substrate. As a result, a mobile phone can be miniaturized.

Next, a description is made on an example of an inspection device which can transmit wirelessly a detected functional data of a biological body referring to FIGS. 13A to 13D. In an inspection device 3950 shown in FIG. 13A, a wireless chip 3951 of the present invention is included in a capsule 3952 of which a protection layer is coated. Between the capsule 3952 and the wireless chip 3951 may be filled with a filler 3953.

Figure 13A:
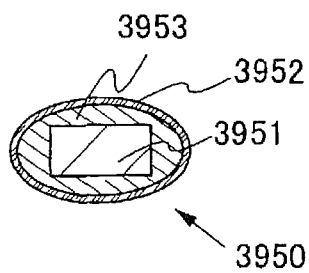
FIG. 13A to 13D are diagrams describing an application of a wiring chip of the present invention.
Figure 13B:
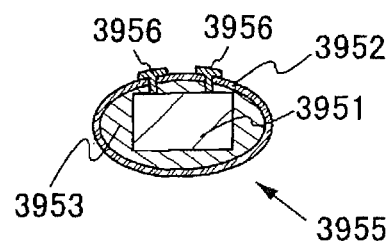
Figure 13C:
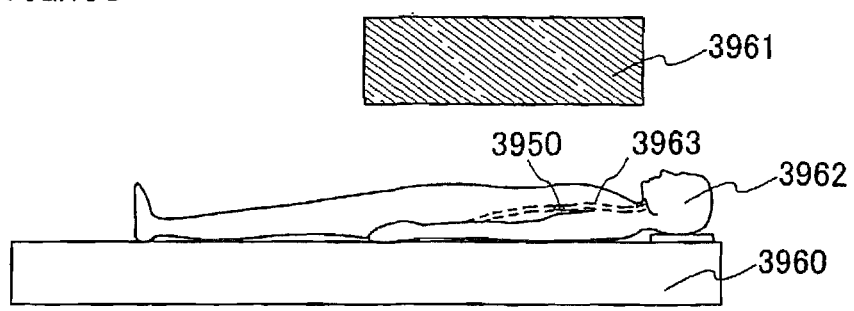

In an inspection device 3955 shown in FIG. 13B, the wireless chip 3951 of the present invention is included in the capsule 3952 of which the protection layer is coated. In addition, an electrode 3956 of the wireless chip is exposed at the outside of the capsule 3952. Between the capsule 3952 and the wireless chip 3951 may be filled with the filler 3953.

The wireless chips 3951 of the inspection devices 3950 and 3955 include a sensor device as shown in Embodiment Modes 2 or 3. In the sensor device, physical quantity and the chemical quantity are measured so as to detect a functional data of a biological body. Note that it is possible to transmit to a reader/writer by converting the detected results into a signal. For the physical quantity, in the case of detecting pressure, light, acoustic wave, or the like, the inspection device 3950 in which the electrode is not exposed in the outside of the capsule 3952 can be used. In the case where the chemical material such as temperature, flow rate, magnetism, acceleration, humidity, a gas component like gas, and a liquid component like ion are detected, it is preferable to use the inspection device 3955 in which the electrode 3956 is exposed in the outside of the capsule 3952 as shown in FIG. 13B.

In the case where an inspection device images the inside of human body, a light-emitting device such as an LED (Light Emitting Diode) and an EL may be provided in the inspection device. As a result, it is possible to image the inside of human body.

The protection layer provided in the surface of the capsule is preferably includes diamond like carbon (DLC), silicon nitride, silicon oxide, silicon nitride, silicon oxynitride or carbon nitride. The capsule and filler are known one selected appropriately. By providing the protection layer in the capsule, it is possible to prevent the capsule or the wireless chip from melting and being denatured inside the body.

Note that the wireless chip having a battery as shown in Embodiment Mode 3 may be used for a sensor device in order to transmit data of the detected result from an inspection device to a reader/writer automatically.

Next, a description is made on the method of an inspection device. The inspection device 3950 or 3955 is swallowed by an examinee 3962, and is moved inside a body lumen 3963. The detected results by the sensor device of the wireless chip is transmitted to a reader/writer 3961 which is set near the examinee. The reader/writer receives the results. As a result, functional data of the biological body of the examinee can be detected on the spot without collecting the wireless chip. Further, the images of body lumen and digestive organs can be taken out.

Figure 13D:
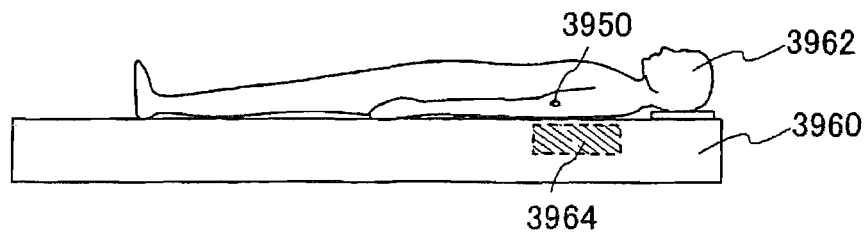

By embedding the inspection device 3950 or 3955 in the examinee 3962, as shown in FIG. 13D, the results detected by a sensor device of the wireless chip is transmitted to a reader/writer 3964 which is set near the examinee. In this case, the inspection device 3955 is embedded in body so as to touch the electrode 3956 with the portion of the examinee's body for measuring. The reader/writer receives the results. The received results is stored and processed by a biological data management computer, the biological data of the examinee can be managed. In addition, by providing the reader/writer 3964 in a bed 3960, biological data can be detected at all the times for the examinee having a difficulty in moving due to a defective function in body. Thus, the disease state and health condition can be managed.

The present embodiment can be combined with any one of the above embodiment modes, appropriately.

Embodiment 2

In the present embodiment, a description is made on a detecting method by a sensor device and transmission/reception methods of the detected data in the wireless chip having a sensor device, referring to FIGS. 8A to 10.

Figure 8A:
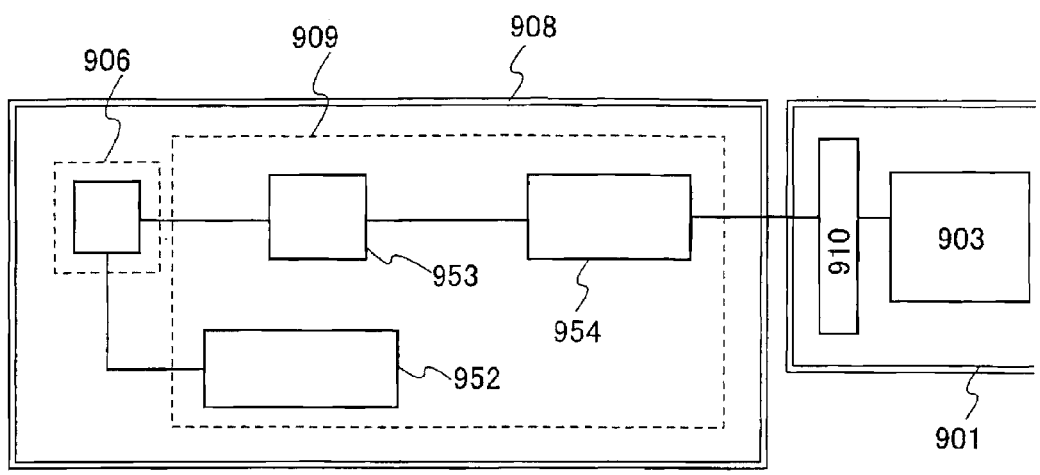
FIGS. 8A and 8B are diagrams describing a wireless chip which is related to the present invention.

FIG. 8A describes one example of a sensor device which detects brightness of circumstance or light-emission. A sensor device 908 has a sensor element 906 and a sensor circuit 909. The sensor element 906 is formed with photodiode, phototransistor, or the like. The sensor circuit 909 includes a sensor driving circuit 952, a detecting circuit 153 and an A/D converter circuit 954.

Figure 8B:
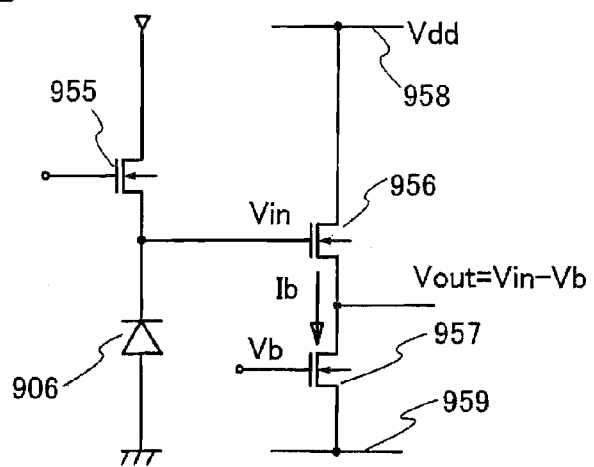

FIG. 8B describes a detecting circuit 953. In the case where a TFT 955 for reset is conductive, a reverse bias is applied to the sensor element 906. Herein, potential of the sensor element 906 in a negative side terminal is charged to potential of power supply voltage, and the operation is called as reset. After that, the TFT 955 for reset is made non conductive. At this time, potential state changes as time passes due to electromotive force of the sensor element 906. In other words, potential of the sensor element 906 in a negative side terminal which is charged to potential of power supply voltage reduces gradually due to charge generated in photoelectric conversion. After passing a certain time, if a TFT 957 for bias is made conductive, a signal is outputted to the output side through a TFT 956 for amplification. In this case, the TFT 956 for amplification and the TFT 957 for bias operates as a so-called a source follower circuit. FIG. 8B describes an example in which a source follower circuit is formed with an n-channel TFT, however, it can be formed with a p-channel TFT, obviously. Power supply voltage Vdd is added to a power supply line on amplification side 958. Reference potential 0 volt is applied to a power supply line on bias side 959. A drain side terminal of the TFT for amplification is connected to a power supply line on amplification side, and a source side terminal is connected to a drain terminal of the TFT 957 for bias. The source side terminal of the TFT 957 for bias is connected to the power supply line on bias side 959. Bias voltage Vb is applied to a gate terminal of the TFT 957 for bias, and bias current Ib is flowed to the TFT. The TFT 957 for bias functions as constant current source basically. Input voltage Vin is applied to a gate terminal of the TFT 956 for amplification, and a source terminal becomes an output terminal. Input and output relation of the source follower circuit is represented as follows: Vout=Vin−Vb. The output voltage Vout is converted into a digital signal by an A/D conversion circuit 954. The digital signal is outputted to the arithmetic processing circuit portion 903.

Figure 9:
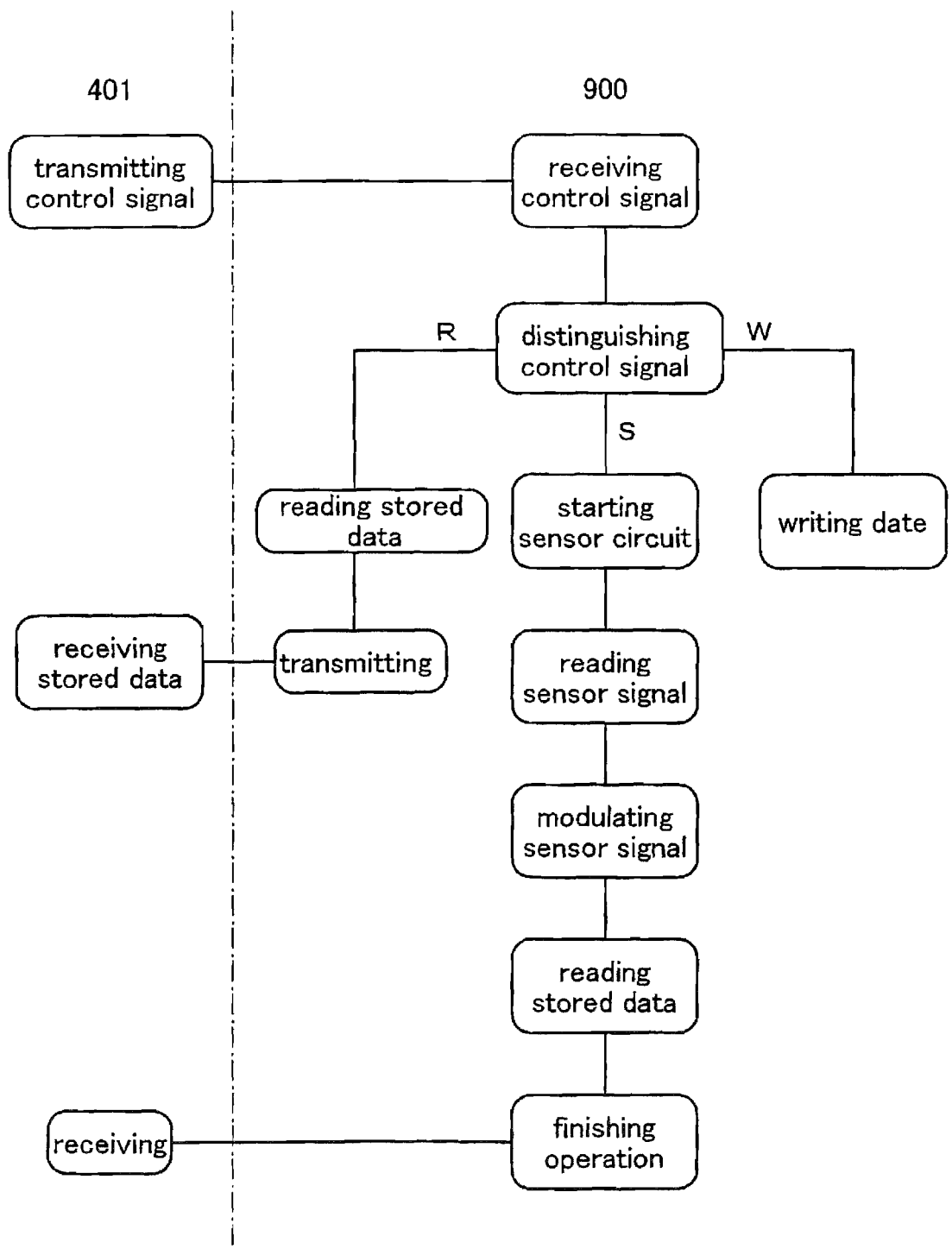
FIG. 9 is a diagram describing an operation method of a wireless chip which is related to the present invention.

FIG. 9 is a flow chart describing operation of a data management device 401 and a wireless chip 900 having a sensor devices 908. The data management device 401 transmits a control signal such as a sensor device starting signal, a data reading signal, and a data writing signal. The control signal is received by the wireless chip 900. The wireless chip 900 distinguishes the control signal with an arithmetic processing circuit. Then, which operation is conducted is determined from the three operations: measurement and storage of data by operating the sensor element 906; reading of data stored in a memory portion; and writing data in a memory portion. In the operation of measurement and storage of data, the sensor circuit 909 is operated, and a signal of the sensor element 906 is read. Then, the signal is binarized through the sensor circuit 909, and stored in a memory portion. In the operation of writing data, the data transmitted from the data management device 401 is written in the memory portion 904. In the operation of reading data stored in the memory portion, data of the memory portion 904 is read, and transmitted to the data management device 401. The power required for operating circuit is generated with transmission of a signal or as needed.

Figure 10:
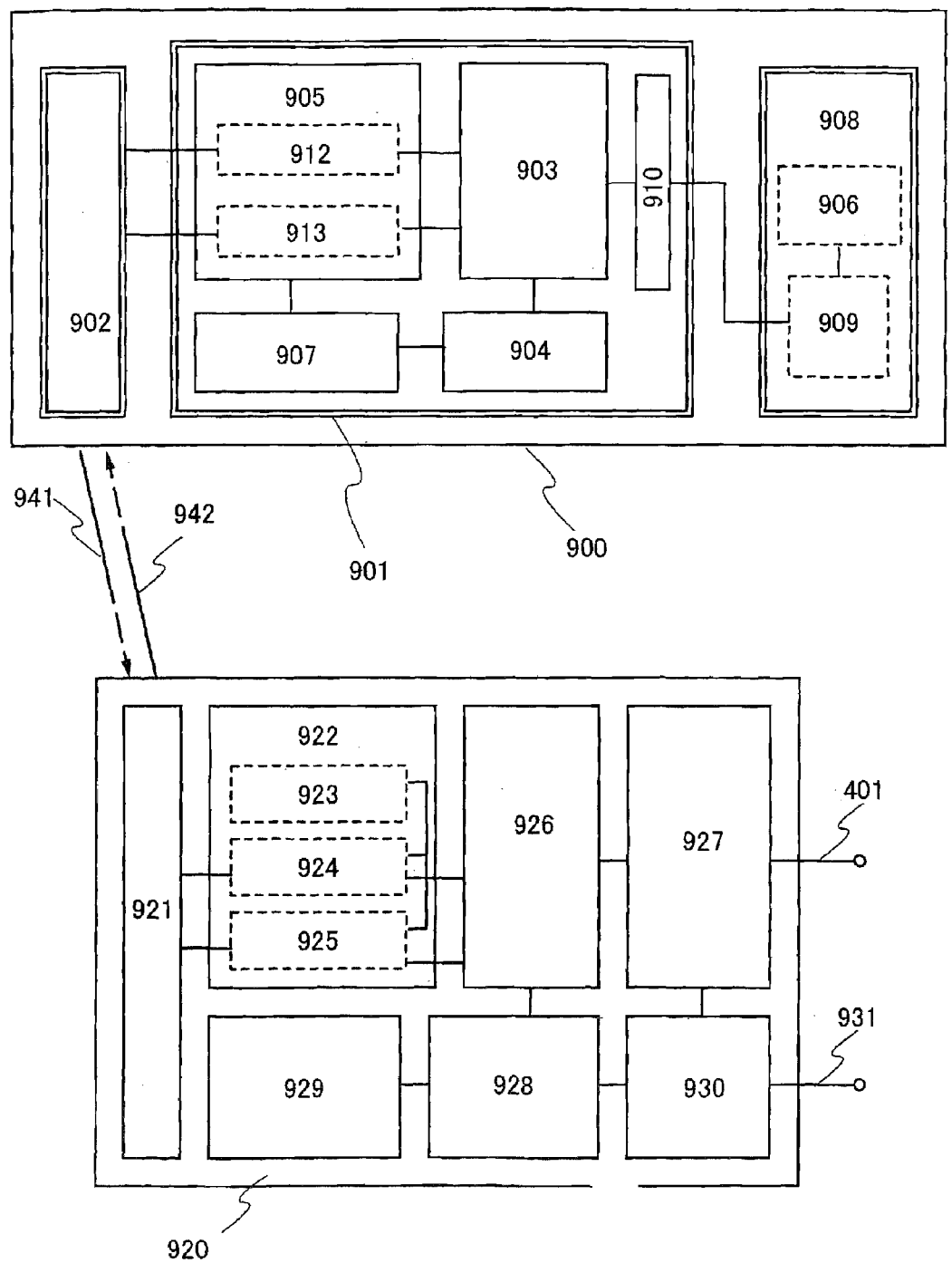
FIG. 10 is a diagram describing a transmission/reception method of a wireless chip and a reader/writer which are related to the present invention.

Next, a description is made on a system of transmitting and receiving data detected by the sensor device 908 of the wireless chip with a reader/writer of the data management device 401 referring to FIG. 10. FIG. 10 describes one example of a reader/writer 920 which transmits and receives the wireless chip 900 of the present invention and data of the wireless chip 900. The reader/writer 920 includes a communication circuit portion 922 having an antenna 921, a transmitter 923, a demodulation circuit 924, and a modulation circuit 925. In addition, an arithmetic processing circuit portion 926 and an external interface portion 927 are included. In order to transmit and receive a control signal through encryption, an encryption/decryption circuit portion 928 and a memory portion 929 are included. A power supply circuit portion 930 supplies electric power to each circuit, and supplies the electric power supplied from an external power supply 931 to each circuit.

After data detected by the sensor device 908 of the wireless chip 900 is processed with the arithmetic processing circuit portion 903, it is stored in the memory portion 904. A signal 942 that is transmitted as an electric wave after passing the modulation circuit 925 of the reader/writer 920 is converted into an AC electric signal due to electromagnetic induction in an antenna 902 of the wireless chip 900. In a demodulation circuit 912 of the communication circuit portion 905, the AC electric signal is demodulated and transmitted to the arithmetic processing circuit portion 903 in subsequent stage. In the arithmetic processing circuit portion 903, data detected by a sensor device which is stored in the memory portion 904 is called up in accordance with the inputted signal. Then, the signal is transmitted from the arithmetic processing circuit portion 903 to the modulation circuit 913, and modulated into an AC electric signal in the modulation circuit 913. After that, the AC electric signal 941 is transmitted to the antenna 921 of the reader/writer 920 through the antenna 902.

The AC electric signal 941 received with the antenna 921 of the reader/writer 920 is demodulated with the demodulation circuit 924 of the communication circuit portion 922, and transmitted to the arithmetic processing circuit portion 926 and the external interface portion 927 in subsequent stage. Then, the data detected by a sensor device is displayed in a display connected to the external interface portion 927 and the data management device 401 such as a computer.

Embodiment 3

Figure 15:
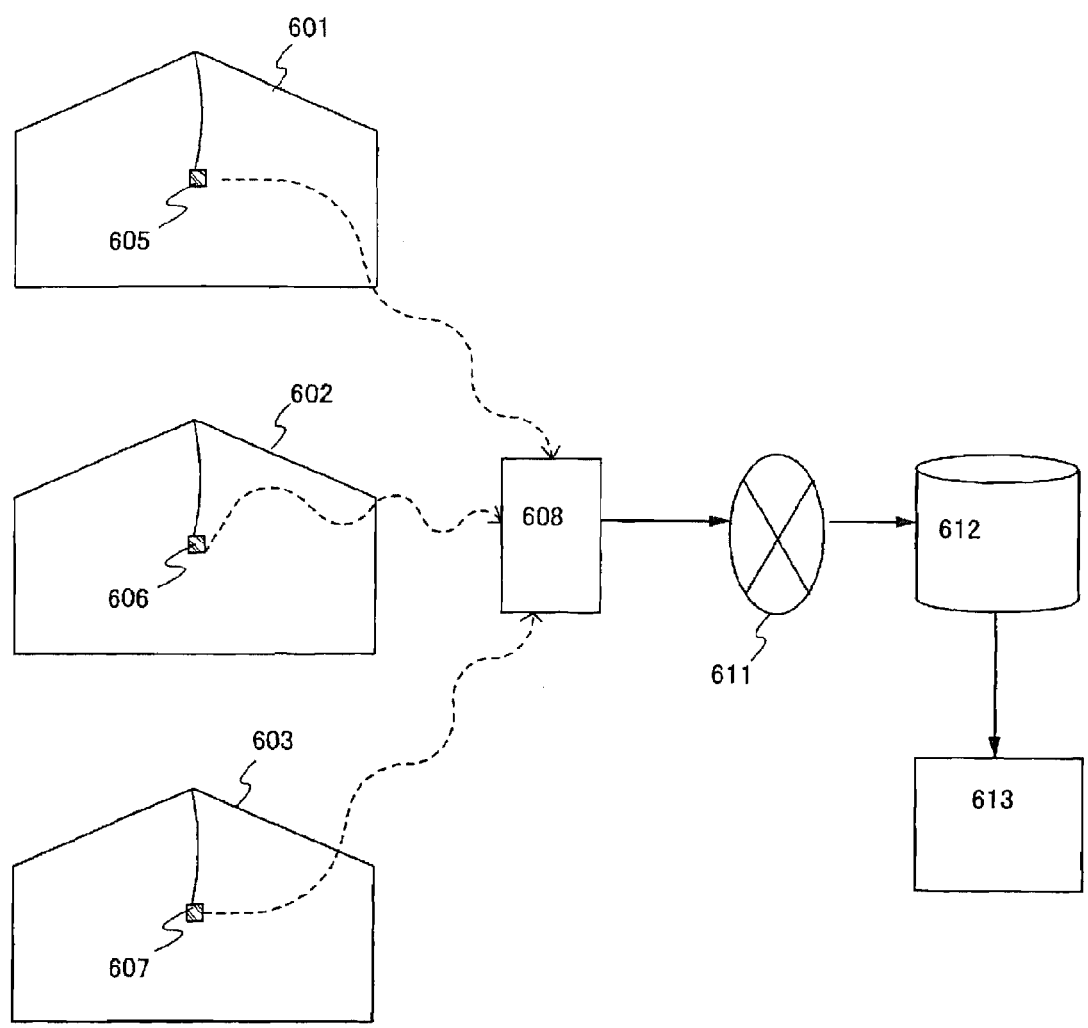
FIG. 15 is a diagram describing an application of a wireless chip of the present invention.

The present embodiment describes a management system of a glass house and a domesticated plant referring to FIG. 15.

In the management system of a glass house and a domesticated plant shown in FIG. 15, wireless chips 605 to 607 are included in each of the glass houses 601 to 603. The wireless chips 605 to 607 have a battery and a sensor device. In addition, the sensor device which detects temperature, humidity, lighting intensity, or the like is used.

The sensor device of the wireless chip measures data such as temperature, humidity, and lighting intensity of the glass houses 601 to 603, and the results are transmitted to a reader/writer 608. Since the wireless chip of the present embodiment has a battery, the transmitting distance can be set long. Thus, the reader/writer is not necessarily provided in each glass house, so that the number of the reader/writers can be reduced.

The reader/writer 608 is connected to an interface 611. The data received by the reader/writer 608 such as temperature, humidity, lighting intensity, or the like of a glass house is transmitted to a data base 612 such as a house of a producer, a management center, or the like through the interface 611. The data such as temperature, humidity, lighting intensity, or the like is displayed in a terminal 613 provided in the house of the producer, the management center, or the like, and the data is stored in the data base.

The interface 611 is a means for transmitting and receiving data detected by sensor devices of the wireless chips 605 to 607 to the outside over internet, phone line, or the like.

By providing the wireless chip of the present invention in a glass house, it is possible to know data such as temperature, humidity, lighting intensity, or the like remotely in real time, and the detailed cultivation data can be recorded.

The present embodiment and any one of the above embodiment modes can be combined appropriately.

This application is based on Japanese Patent Application serial no. 2005-103233 filed in Japan Patent Office on 31 Mar. 2005, and the entire contents of which are hereby incorporated by reference.

EXPLANATION OF REFERENCE

20: wireless chip, 31: detecting element, 101: chip, 103: patch antenna, 104: under fill, 110: dielectric layer, 111: conductive layer, 112: conductive layer, 113: power feeding layer, 114: under fill, 121: wiring substrate, 122: sensor device, 126: connection terminal, 127: connection terminal, 129: conductive layer, 141: battery, 142: connection terminal, 143: connection terminal, 144: conductive layer, 153: detecting circuit, 201: dielectric layer, 202: conductive layer, 203, conductive layer, 204: power feeding point, 205: degenerate separation element, 211: dielectric layer, 212: conductive layer, 213: conductive layer, 214: power feeding point, 215: degenerate separation element, 221: dielectric layer, 222; conductive layer, 223: conductive layer, 224: power feeding layer, 225: degenerate separation element, 241: dielectric layer, 242: conductive layer, 243: conductive layer, 244: power feeding layer, 301: antenna, 302: duplexer, 303: low noise amplifier (LNA), 304: band pass filter (BPF), 305: mixer, 306: hybrid circuit, 307: band pass filter (BPF), 308: SAW filter, 309: amplifier, 310: mixer, 311: local oscillation circuit, 312: amplifier, 313: base band unit, 321: mixer, 322: voltage control transmission circuit (VCO), 323: band pass filter (BPF), 324: power amplifier (PA), 325: coupler, 326: attenuator (APC), 327: isolator, 328: low pass filter, 331: antenna front end module, 332: isolator power amplifier module, 401: data management device, 500: substrate, 502: field-effect transistor, 503: gate insulating film, 504: gate electrode, 508: interlayer insulating layer, 511: interlayer insulating layer, 512: connection terminal, 514: insulating layer, 601: glass house, 605: wireless chip, 608: reader/writer, 611: interface, 612: data base, 613: terminal, 900: wireless chip, 901: chip, 902: antenna, 903: arithmetic processing circuit portion, 904: memory portion, 905: communication circuit portion, 906: sensor element, 907: power supply circuit portion, 908: sensor device, 909: sensor circuit, 910: bus, 912: demodulation circuit, 913: modulation circuit, 920: reader/writer, 921: antenna, 922: communication circuit portion, 923: transmitter, 924: demodulation circuit, 925: modulation circuit, 926: arithmetic processing circuit portion, 927: external interface portion, 928: encryption/decryption circuit portion, 929: memory portion, 930: power supply circuit portion, 931: external power supply, 941: electric signal, 942: signal, 952: sensor driving circuit, 953: detecting circuit, 954: A/D converter circuit, 955 TFT for reset, 956: TFT for amplification, 957: TFT for bias, 958: power supply line on amplification side, 959: power supply line on bias side, 102*a*: conductive layer, 102*b*: conductive layer, 102*c*: conductive layer, 104*a*: connection terminal, 104*b*: connection terminal, 123*a*: connection terminal, 123*b*: connection terminal, 124*a*: conductive layer, 124*b*: conductive layer, 125*a*: connection terminal, 125*b*: connection terminal, 2700: case, 2701: panel, 2702: housing, 2703: print wiring substrate, 2704: operating button, 2705: battery, 2708: connection film, 2709: pixel region, 2710: wireless chip, 3900: bag, 3901: bicycle, 3902: mobile phone, 3903: goggle with earphone, 3904: speaker device, 3905: headphone, 3906: fireworks ball, 3950: inspection device, 3951:

wireless chip, 3952: capsule, 3953: filler, 3955: inspection device, 3956: electrode, 3960: bed, 3961: reader/writer, 3962: examinee, 3963: body lumen, 3964: reader/writer, 501*a*: element isolation region, 505*a*: drain region, 506*a*: low concentration impurity region, 507*a*: sidewall, 509*a*: drain wiring, 913*a*: modulation circuit

What is claimed is:

1. A semiconductor device comprising:
   an antenna comprising a first conductive layer, the first conductive layer comprising a first surface, a second surface and a third surface;
   a second conductive layer comprising a fourth surface;
   a first portion overlapping the first conductive layer, the first portion comprising an arithmetic processing circuit, a memory, a communication circuit, and a power supply circuit;
   a second portion electrically connected to the first portion, the second portion comprising a sensor element; and
   a resin layer in direct contact with the antenna,
   wherein the first surface faces the fourth surface,
   wherein the resin layer is in direct contact with an entirety of the first surface and an entirety of the fourth surface,
   wherein the first surface is oriented in a different direction than the second surface, and
   wherein the second surface is oriented in a different direction than the third surface.

2. The semiconductor device according to claim 1, further comprising a third conductive layer electrically connected to the antenna and the first portion,
   wherein the third conductive layer is provided between the antenna and the first portion.

3. The semiconductor device according to claim 1,
   wherein the memory comprises any one of a static RAM, an EEPROM, a flash memory, and an organic memory.

4. The semiconductor device according to claim 1,
   wherein the memory is configured to record a data transmitted through the antenna.

5. The semiconductor device according to claim 1,
   wherein the communication circuit comprises a demodulation circuit and a modulation circuit, and
   wherein the demodulation circuit is configured to demodulate a signal inputted through the antenna.

6. The semiconductor device according to claim 1,
   wherein the communication circuit comprises a demodulation circuit and a modulation circuit, and
   wherein the demodulation circuit is configured to output a signal to the arithmetic processing circuit.

7. The semiconductor device according to claim 1,
   wherein the first portion further comprises a transistor electrically connected to the antenna.

8. The semiconductor device according to claim 1, further comprising a panel electrically connected to the first portion,
   wherein the panel comprises a pixel region.

9. A semiconductor device comprising:
   an antenna comprising a first conductive layer, the first conductive layer comprising a first surface, a second surface and a third surface;
   a second conductive layer comprising a fourth surface;
   a first portion overlapping the first conductive layer, the first portion comprising an arithmetic processing circuit, a memory, a communication circuit, and a power supply circuit;
   a second portion electrically connected to the first portion, the second portion comprising a sensor element; and
   a resin layer in direct contact with the antenna, the resin layer comprising any one of an epoxy resin, an acrylic resin, and a polyimide resin,
   wherein the first surface faces the fourth surface,
   wherein the resin layer is in direct contact with an entirety of the first surface and an entirety of the fourth surface,
   wherein the first surface is oriented in a different direction than the second surface, and
   wherein the second surface is oriented in a different direction than the third surface.

10. The semiconductor device according to claim 9, further comprising a third conductive layer electrically connected to the antenna and the first portion,
    wherein the third conductive layer is provided between the antenna and the first portion.

11. The semiconductor device according to claim 9,
    wherein the memory comprises any one of a static RAM, an EEPROM, a flash memory, and an organic memory.

12. The semiconductor device according to claim 9,
    wherein the memory is configured to record a data transmitted through the antenna.

13. The semiconductor device according to claim 9,
    wherein the communication circuit comprises a demodulation circuit and a modulation circuit, and
    wherein the demodulation circuit is configured to demodulate a signal inputted through the antenna.

14. The semiconductor device according to claim 9,
    wherein the communication circuit comprises a demodulation circuit and a modulation circuit, and
    wherein the demodulation circuit is configured to output a signal to the arithmetic processing circuit.

15. The semiconductor device according to claim 9,
    wherein the first portion further comprises a transistor electrically connected to the antenna.

16. The semiconductor device according to claim 9, further comprising a panel electrically connected to the first portion,
    wherein the panel comprises a pixel region.

* * * * *